United States Patent
Prelas et al.

(10) Patent No.: US 6,527,854 B1
(45) Date of Patent: Mar. 4, 2003

(54) METHOD FOR CONTACT DIFFUSION OF IMPURITIES INTO DIAMOND AND OTHER CRYSTALLINE STRUCTURES AND PRODUCTS

(76) Inventors: Mark A. Prelas, 506 Laurel Dr., Columbia, MO (US) 65203; Fariborz Golshani, 19608 Pruneridge, Apt. 2103, Cupertino, CA (US) 95014; Robert V. Tompson, Jr., 2201 Bridgewater Dr., Columbia, MO (US) 65202

( * ) Notice: Subject to any disclaimer, the term of this patent is extended or adjusted under 35 U.S.C. 154(b) by 0 days.

(21) Appl. No.: 09/719,736
(22) PCT Filed: Jun. 16, 1999
(86) PCT No.: PCT/US99/13566
§ 371 (c)(1), (2), (4) Date: Dec. 14, 2000
(87) PCT Pub. No.: WO99/66109
PCT Pub. Date: Dec. 23, 1999

(51) Int. Cl.$^7$ ............................................. C30B 25/08
(52) U.S. Cl. ........................... 117/79; 117/2; 117/929; 423/446; 427/255.3
(58) Field of Search ........................... 117/2, 79, 929; 423/446; 427/255.3

(56) References Cited

U.S. PATENT DOCUMENTS 5,597,762 A    1/1997   Popovici et al. ............ 437/169
5,723,391 A  * 3/1998   Hunter et al. ............... 423/345
5,762,896 A  * 6/1998   Hunter et al. ............... 423/345

OTHER PUBLICATIONS

PP. 945–983 & 1043–1072, Handbook Of Industrial Diamonds & Diamond Films, edited by Mark A. Prelas et al., copyright 1998.

* cited by examiner

*Primary Examiner*—Felisa Hiteshew
(74) *Attorney, Agent, or Firm*—Haverstock, Garrett & Roberts LLP

(57) ABSTRACT

A low free energy method for more rapidly diffusing an impurity as exemplified by boron, into a natural or synthetic diamond or other crystalline element in powdered or granular form, without degradation of the crystalline structure. The present method includes the steps of providing a mixture of the diamond or other crystalline element and the impurity in a solid phase; treating the mixture to bring the impurity into conforming contact with the outer surface of the crystalline element; and heating the mixture to a temperature between about 200° C. and about 2000° C. As an example, a diamond is disclosed having boron as an impurity diffused into the crystalline structure thereof by the present method, at a ratio of from about 0.1 part of the impurity per 1 million parts of the diamond to about 600 parts of the impurity per 1 million parts of the diamond.

19 Claims, 9 Drawing Sheets

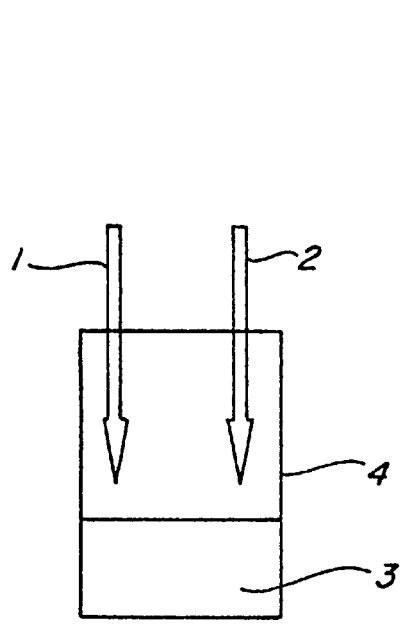
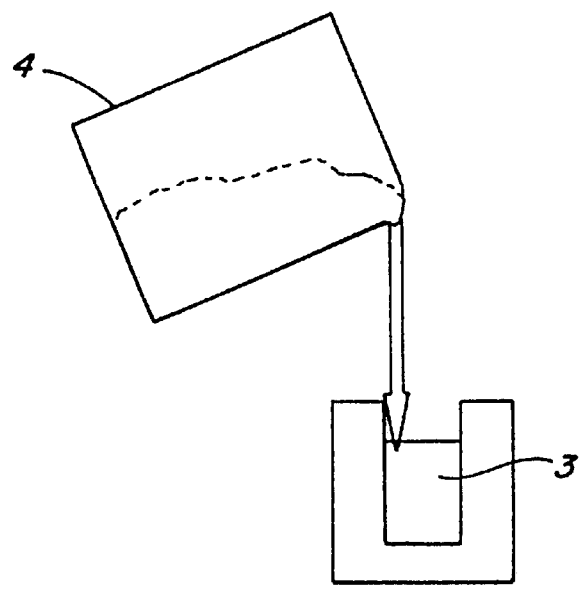
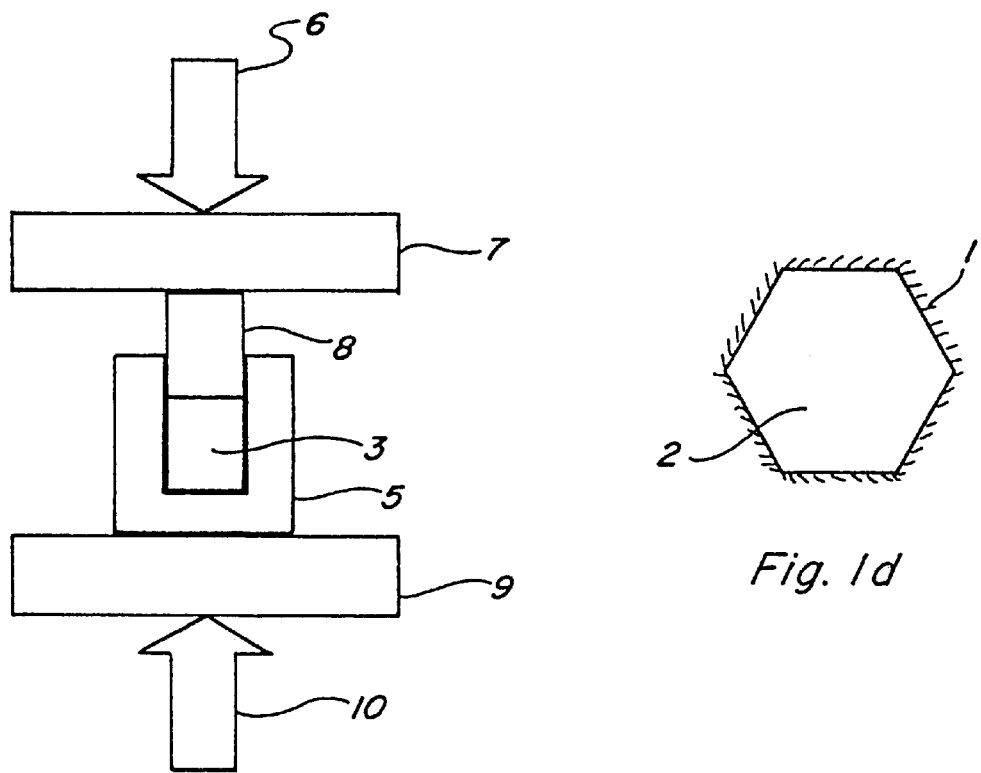
Fig. 1a
Fig. 1b
Fig. 1c
Fig. 1d

METHOD FOR CONTACT DIFFUSION OF IMPURITIES INTO DIAMOND AND OTHER CRYSTALLINE STRUCTURES AND PRODUCTS

This Application is a 371 of PCT/US99/13566 Jun. 16, 1999.

TECHNICAL FIELD

This invention relates generally to impurity addition to crystalline structures and elements, and more particularly, to adding impurities to crystalline structures and elements, such as, but not limited to, natural diamond, synthetic diamond, and the like, by a method which utilizes a combination of temperature, material properties and geometry to achieve contact diffusion of the impurity into the crystalline structure, and products made by the method.

BACKGROUND ART

Currently, natural diamond, synthetic diamond and other like crystalline elements, have been used individually, and in aggregate form, as components of slurries, films, composites, and the like, in abrasives, cutting elements, semi-conductors, and other applications. For such applications, diamond and the other crystalline elements are required to have certain mechanical, chemical and electrical properties, the enhancement of which would provide both economic and functional advantage.

As an example, when used as an abrasive, diamond is subject to the stress of grinding and potentially high temperatures. At high temperatures, diamond is subject to graphitization and/or chemical attack from oxygen. Impurities such as silicon and boron in a diamond crystal help the crystal to resist both the graphitization process and chemical attack from oxygen.

It is also important that diamond abrasives have good mechanical properties. Synthetic diamond, which represents a large portion of the industrial diamond market, has inherent defects in the crystal structure due to the growth process. These defects have an adverse effect on the mechanical properties of the material. It has been shown that the mechanical properties of synthetic diamond can be improved by the addition of impurities into the crystal.

Diamond and beryl are examples of crystalline elements wherein the optical properties thereof are important when they are used as gemstones. The optical properties of these crystalline elements can also be improved by the addition of impurities.

Additionally, the semi-conductor industry has long desired to use diamond as a semi-conductor material due to its advantageous temperature resistance and other properties. However, making diamond an N-type semi-conductor has long been a problem.

It is known to make impurity additions to diamond and other crystalline elements by methods such as insitu doping (adding impurities during the growth phase) and by ion implantation. Both processes have significant problems, most important among which in the present context is an unacceptable level of defects in the resulting crystalline structure. Defects tend to weaken the desirable properties of diamond, albeit mechanical, chemical, optical or electrical.

Addition of impurities during the growth phase of a synthetic diamond crystal leads to defects because there is a large amount of free energy available during the growth phase. Any imperfections introduced as the crystals grow, such as impurity defects, tend to be points where bulk defects can take root during the growth phase. This can seriously degrade the quality of the diamond crystals thus produced.

Addition of impurities by implantation also leads to an unacceptable level of defects. In the implantation process, energetic ions are present which are a source of free energy. As the ion streams through the crystal, energy is deposited in the crystal and bulk defects occur around the path of the ion. The damage to the crystal is further enhanced due to a cascading effect that radiates outward from the ion path. Even after annealing the crystal, an unacceptable level of defects remain in the crystal structure.

The known industrial processes such as ion implantation and insitu growth are well described in the literature. See, for example: David Dreifus and Bradley Fox, "Active Devices," in *Handbook of Industrial Diamonds and Diamond Films,* M. Prelas, G. Popovici, and K. Bigelow editors (Marcell Dekker, 1998) pages 1043–1072. R. Kalish and S. Prawer, "Ion Implantation of Diamond and Diamond Films," *Handbook of Industrial Diamonds and Diamond Films,* M. Prelas, G. Popovici, and K. Bigelow editors (Marcell Dekker, 1998) pages 945–982.

Reference also Popovici et al. U.S. Pat. No. 5,597,762 issued Jan. 28, 1997 entitled Field-Enhanced Diffusion Using Optical Activation, which discloses an ion implantation process for doping diamond material with impurities to make N-type diamond semi-conductors usable in electronic, optical, and other applications. However, the method of the Popovici et al. patent has been found to be limited to use on solid diamond substrates including films and the like, as it is required to create a high voltage across the substrate to provide polarization for ion flow. When the process is attempted to be used with crystalline powders and aggregates, it has been found that the required voltage cannot be achieved, essentially due to shorting of the ion paths.

Additionally, both ion implantation and insitu growth are slow. For instance, it has been found that when the ion implantation method disclosed in Popovici et al. is used, a maximum impurity density in the diamond of only about 0.05 parts per million is achieved after 8 hours of diffusion.

Thus, what is required is a method for the addition of impurities into diamond and other crystalline structures, which involves low free energy so as to avoid defects and resultant crystalline degradation, which can be used with diamond and other crystalline structure in powdered or granular form, and which adds the impurity at a faster rate than known diffusion processes.

Accordingly, the present invention is directed to overcoming one or more of the problems as set forth above.

DISCLOSURE OF THE INVENTION

In one aspect of the present invention, a low free energy method for more rapidly diffusing an impurity into a diamond or other crystalline element in powdered or granular form, without degradation of the crystalline structure, is disclosed. The present method includes the steps of providing a mixture of the diamond or other crystalline element and the impurity in a solid phase; treating the mixture to bring the impurity into substantially conforming contact with substantially all of the outer surface of the crystalline element; and heating the mixture to a temperature between about 200° C. and about 2000° C.

A feature of the present invention is the capability of diffusing the impurity into a crystalline element such as natural or synthetic diamond, beryl or goshanite in an individual crystal or powdered form having a grain size ranging from as small as a very small fraction of a micrometer to greater than a millimeter.

Another feature of the invention is that the impurity can consist of a wide variety of substances, including, but not limited to, boron, lithium, nitrogen, oxygen, fluorine, sodium, aluminum, sulfur, chlorine and compatible mixtures thereof.

Another feature of the invention is that the impurity can be diffused into the crystalline element in an amount ranging from as little as a fraction of one part of the impurity per 1 million parts of the crystalline element to as much as several thousand parts of the impurity per 1 million parts of the crystalline element or more.

As another feature of the invention, the heating of the mixture to diffuse the impurity into the crystalline element can be for a time period of as little as a fraction of a minute to several hundred hours.

As another aspect of the present invention, a diamond having an impurity diffused into the crystalline structure thereof at a ratio of from about 0.1 part of the impurity per 1 million parts of the diamond to about 600 parts of the impurity per 1 million parts of the diamond, is disclosed.

Another feature of the invention is that the fundamental crystalline structure is virtually unchanged by the diffusion of the impurity therein, such that mechanical, chemical, optical and electrical properties of the diamond crystalline are unchanged and in some instances, are enhanced.

As another feature of the invention, by the diffusion of boron into diamond, the oxidation and graphitization resistance properties of the diamond are enhanced.

As another feature of the invention, by the diffusion of lithium into diamond, the diamond becomes an N-type semi-conductor.

BRIEF DESCRIPTION OF THE DRAWINGS

For a better understanding of the present invention, reference may be made to the accompanying drawings in which:

FIG. 1a is a schematic representation showing mixing an impurity with crystalline element;

FIG. 1b is a schematic representation showing the mixture of FIG. 1a being poured into a pressing fixture;

FIG. 1c is a schematic representation of the mixture of FIG. 1a being compacted in the fixture of FIG. 1b by a hydraulic press;

FIG. 1d is a sectional representation showing conforming contact between the impurity and the outer surface of a crystalline element resulting from compaction;

BEST MODE FOR CARRYING OUT THE INVENTION

Figure 1E:
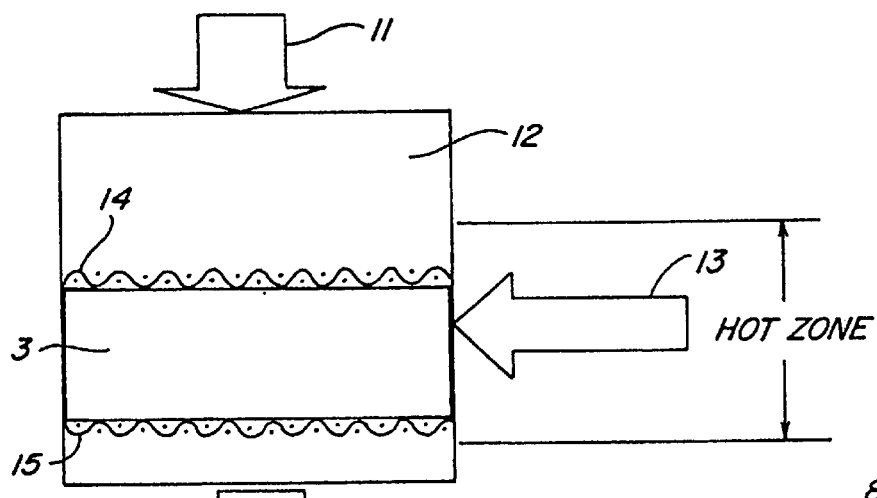
FIG. 1e is a schematic representation showing the compacted mixture of FIGS. 1a–1c being heated in an oven.

Referring now to the drawings, a preferred method for diffusion of an impurity into a crystalline element according to the teachings of the present invention and representative crystalline elements having an impurity diffused therein according to the invention are shown.

Here, it should be noted that it is contemplated that the method according to the present invention can be utilized for impurity addition to a wide variety of crystalline elements and structures, including, but not limited to natural or mined diamond, high-pressure high temperature synthetic diamond crystals, diamond films, and goshanite. Impurities that have been diffused into the crystalline elements include lithium, boron, nitrogen, oxygen, fluorine, sodium, aluminum, sulfur, and chlorine. It is contemplated that compatible mixtures of the above impurities, as well as other impurities, can be successfully diffused into a crystalline element using the present method.

To illustrate the present invention, the steps for diffusion of boron in a solid phase in powered form into diamond, also in powdered form, is disclosed in reference to FIGS. 1a–1e.

Turning to FIG. 1a, boron powder 1 is placed with diamond powder 2 in a mixing vessel 4 and the powders are mixed to generally uniformly disperse grains or particles of the diamond powder among the grains or particles of the boron powder, such as by hand mixing or shaking, to form a mixture 3 of the boron powder and diamond powder.

Referring to FIG. 1b, mixture 3 is poured from mixing vessel 4 into a pressing fixture 5.

In FIG. 1c, the pressing fixture 5 is shown assembled by placing a plunger 8 in an upper opening thereof in communication with mixture 3. The pressing fixture 5 and plunger 8 are then placed on a lower pressure plate 9 of a conventional hydraulic press. An upper pressure plate 7 of the hydraulic press is brought into contact with the top of plunger 8. The hydraulic press is then operated to exert a compressive force on plunger 8 and pressing fixture 5 as denoted by arrows 6 and 10 to compact mixture 3.

Here, it should be understood that crystalline elements such as the individual grains or crystals of diamond powder 2 have multiple facetted outer surfaces. Suitable compaction of mixture 3 is achieved when the boron powder 1 is brought into substantially conforming contact with the outer surface of the grains or crystals of the diamond powder 2, as illustrated in FIG. 1d. Compaction also serves to substantially reduce the number and size of interstices or spaces between the grains of the powders. To facilitate achieving suitable conforming contact of the boron powder with the individual crystalline elements of the diamond powder, the boron powder 1 has a grain or mesh size of from about 0.1 micrometer to about 10 micrometers diameter and the diamond powder 2 has a grain or mesh size of from about 50 micrometers to about 500 micrometers diameter, such that the diamond powder is the larger grain of the two. Alternatively, the boron powder 1 can be selected so as to have a grain size of from about 50 to about 500 micrometers and the diamond powder 2 can be selected so as to have a grain size of from about 0.004 micrometer to about 10 micrometers diameter. In either instance, since the boron is a softer material than the diamond, the compaction will conform the boron to the shape of the outer surface of the individual diamond particles or grains. In the first instance, the smaller boron particles or grains will be brought together by the compaction, whereas in the second instance, the smaller diamond particles or grains will be embedded or encapsulated in the larger boron particles or grains. Mixture 3 can include a ratio of the boron powder to the diamond powder of from about 0.1:1 to about 50:1 by either weight or volume. A ratio of the boron powder 1 to the diamond powder 2 of about 5:1 by weight or volume is preferred.

Referring to FIG. 1e, the compacted mixture 3 is then removed from pressing fixture 5 and placed on a screen 15 of stainless steel, tungsten, or other suitable material and a second screen 14 of the same material is placed on top of mixture 3. Mixture 3 with screens 14 and 15 thereover and thereunder are then placed as an assembly in a heating chamber 12 of a suitable oven, such as a conventional ceramic tube oven. An inlet gas line 11 and an outlet gas line 16 are attached in fluid communication to the heating chamber 12. A flow of gas is then introduced through inlet line 11 into heating chamber 12 wherein the gas flows through screen 14, around and or through mixture 3 so as to envelope mixture 3, and through screen 15 to outlet gas line 16, while mixture 3 is heated with heat as denoted by arrow 13 in a hot zone of the oven in the conventional manner.

The gas flow through heating chamber 12 can include hydrogen gas mixed with an inert component, for instance, a rare gas such as helium, neon, zeon, krypton, argon, and mixtures thereof, for safety. The gas flow can be provided with a flow rate from about 0.1 cc per minute to about 100 liters per minute, with a ratio of from about 100 parts to about 0.01 part rare gas or inert component to 1 part hydrogen component by weight. The hydrogen component of the gas flow functions to combine with oxygen atoms in and around mixture 3 to reduce or inhibit oxidation of the diamond. Here, it should be noted that as an alternative the gas flow can include inert gases alone. As another alternative, mixture 3 can be heated in a partial or full vacuum environment.

Mixture 3 can be heated for different time periods and at different temperatures to achieve a desired diffusion of the boron into the diamond. Time periods of from about 1 minute to about 500 hours have been found to be satisfactory. Suitable temperatures within the heating chamber 12 are between about 200° C. and about 2000° C. Temperatures closer to 200° C. will generally require a longer heating time, and will achieve a lower degree of diffusion, whereas heating at a higher temperature will achieve a greater degree of diffusion. However, it should be noted that detectable graphitization of the diamond begins to occur at about 1400° C., such that exposure of the diamond to temperatures above that temperature should be limited. Here, it should also be noted that for other crystalline elements, such as goshanite, different temperatures and heating times will be required. For instance, goshanite has been found to develop heat caused surface fractures when heated to about 400° C. or above. Therefore, when diffusion an impurity into goshanite, a lower temperature should be selected.

Figure 1F:
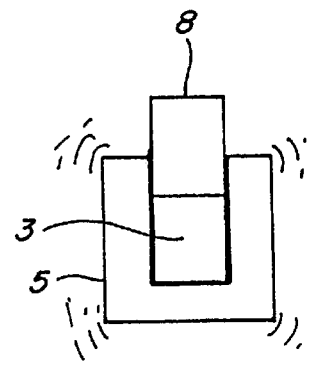
FIG. 1f is a schematic representation of the mixture of FIG. 1a being compacted in the fixture of 1b by vibration.

Referring to FIG. 1f, the boron powder 1 can alternatively be brought into conforming contact with the outer surfaces of the individual grains or crystalline elements of diamond powder 2 by application of vibration. Here, mixture 3 is shown in pressing fixture 5 being vibrated so as to be compacted to achieve the desired contact between the boron and surfaces of the diamond elements.

EXAMPLES

A quantity of diamond powder having a maximum grain size of about 1 millimeter diameter was proportioned into about five cubic centimeter samples, including a control sample to receive no boron diffusion, samples 1, 2 and 3 to be subject to the above described method according to the present invention, and a sample 4 which was also not subjected to the present method, but which was annealed. The diamond powder was a conventionally commercially available diamond powder obtained from General Electric Company.

Each of samples 1, 2, and 3 was placed in a mixing vessel with boron in a solid phase powder having a maximum grain size of about 10 micrometers in a ratio of about 1 part by volume of the diamond powder to about 5 parts by volume of the boron powder. The boron powder used is conventional laboratory grade boron available from a wide variety of commercial chemical suppliers. The samples were mixed in the mixing vessels in the above described manner to achieve a uniform dispersion of the diamond powder and the boron powder.

Each sample 1, 2 and 3 was then compacted by pressing in a conventional hydraulic press sufficiently such that the individual grains of the powders were observed to stick together such that the samples were capable of being removed from the fixture and handled as solid or unitary plugs.

Each of the samples 1, 2 and 3 was then placed between fine stainless steel wire screens in preparation for insertion into a ceramic tube oven for heating.

Referring to Table 1, sample 3 was placed in the heat chamber of a conventional ceramic tube oven heated to 1453 K and left there for 8 hours. During that time, a hydrogen gas flow was maintained through the oven sufficient to provide a pressure condition in the heating chamber slightly greater than atmospheric pressure so as to exclude oxygen from the heating chamber. Sample 2 was placed in the oven heated to 1273 K for 8 hours under the same gas flow. Sample 1 was placed in the oven at 1173 K for 1 hour under the same gas flow condition.

Sample 4 consisting of 5 cc of the diamond powder was placed between two fine mesh stainless steel screens in a ceramic tube and positioned in the tube furnace and was heated at 1453 K for 8 hours under the same gas flow as samples 1, 2 and 3.

After heating, all of the samples were washed with distilled water then boiled in a mixture of chromic acid, sulfuric acid, and nitric acid, to remove undiffused boron and other impurities on the surfaces thereof.

To determine the extent of diffusion of the boron into the diamond, the washed diamonds were analyzed using secondary ion mass spectroscopy and also prompt gamma neutron activation analysis. Prompt gamma neutron activation analysis is a standard procedure in nuclear science for measuring levels of impurities in samples. It is achieved by irradiating the sample in the high neutron flux region of a nuclear reactor core. The sample is sent into the core by a pneumatic tube, irradiated for a specific period and then is pneumatically transported to a gamma detector. The detector measures the gamma energy and intensity as a function of time. The energy, intensity and time dependence of the gamma spectrum provides data about the impurity content of the sample. From this data the density of impurity atoms in the sample is determined and is expressed in parts per million (ppm), the number of atoms of the impurity per million atoms of the host crystalline element. The resultant boron concentrations in parts per million for samples 1, 2 and 3 are shown in the third column of Table 1. Referring to Table 1, for example, sample 3 was found to have a boron concentration of 600 ppm, or 600 atoms boron per 1 million atoms carbon.

Also referring to Table 1, the Young's modulus and Vickers hardness for representative diamond crystals from samples 1, 2, and 3, and also the control sample were determined in the conventional manner and are shown. Sample 4 was not tested in this regard.

TABLE 1

| Sample | Temperature (K) | Boron concentration (ppm) | Young's modulus (Gpa) | Vickers hardness (HV) |
| --- | --- | --- | --- | --- |
| Control | N/A | 0 | 1226 | 103 |
| 1 | 1173 | 10 | 1100 | 91 |
| 2 | 1273 | 100 | 1325 | 116 |
| 3 | 1453 | 600 | 1325 | 110 |
| 4 | 1453 | 0 | N/A | N/A |

Specimens of the diamonds from all of the samples were tested for resistance for oxidation. Oxidation experiments on the samples were performed in a Perkin-Elmer Thermo-Gravimetric Analysis (TGA) system 7. The TGA was programmed for a heating rate of 20° C. per minute to a final temperature of 1370 K. Air with a flow rate of 9.0 cc per minute at atmospheric pressure was used as a carrier gas.

Figure 2:
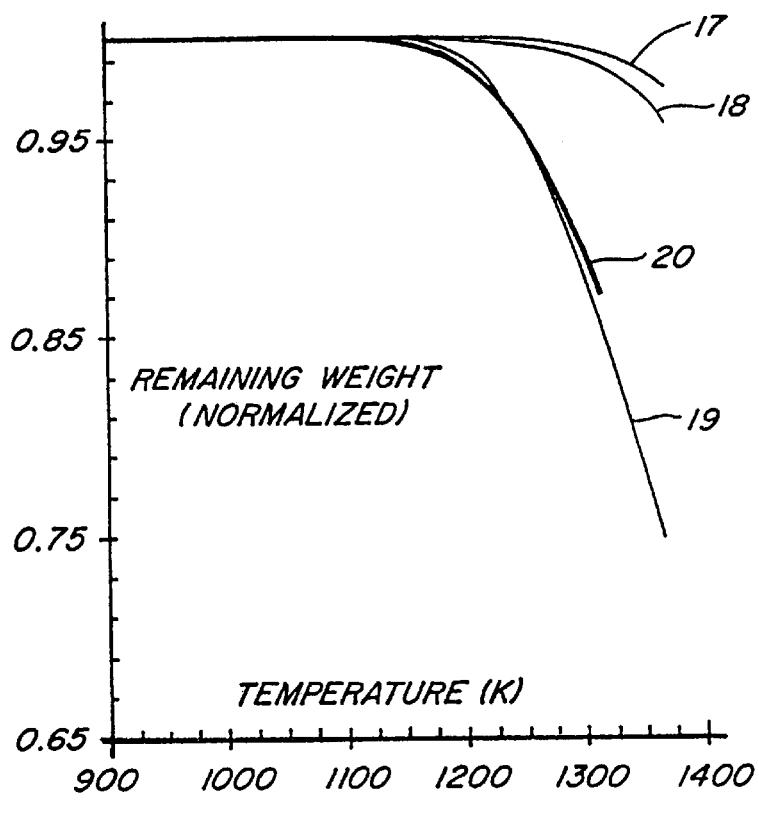
FIG. 2 is a graphical representation of weight change verses temperature for oxidation in air of diamonds having boron diffused therein according to the present invention and diamonds of a control sample without an impurity diffused therein.

FIG. 2 shows results for the oxidation rates of the diamond with 600 parts per million of boron from sample 3 as curve 17, the oxidation rates of the diamond with 100 parts per million of boron from sample 2 as curve 18, the oxidation rates of the diamond with 10 parts per million of boron from sample 1 as curve 19, and the oxidation rate for the diamond of the control sample without boron, as curve 20. The normalized remaining weight values shown can be multiplied by 100 to obtain a percent remaining weight.

Turning to FIGS. 3a–3l, scanning electron micrographs of diamonds from the samples are shown.

Figure 3A:
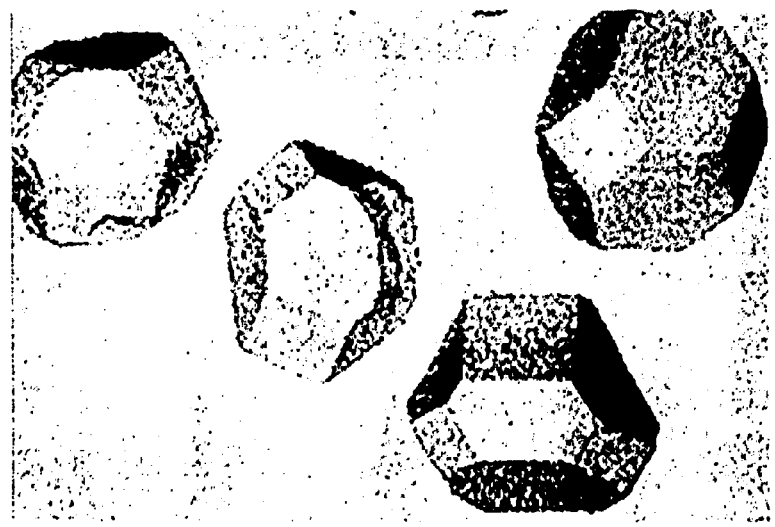
FIG. 3a is a scanning electron micrograph of diamonds from the control sample before oxidation thereof.
Figure 3B:
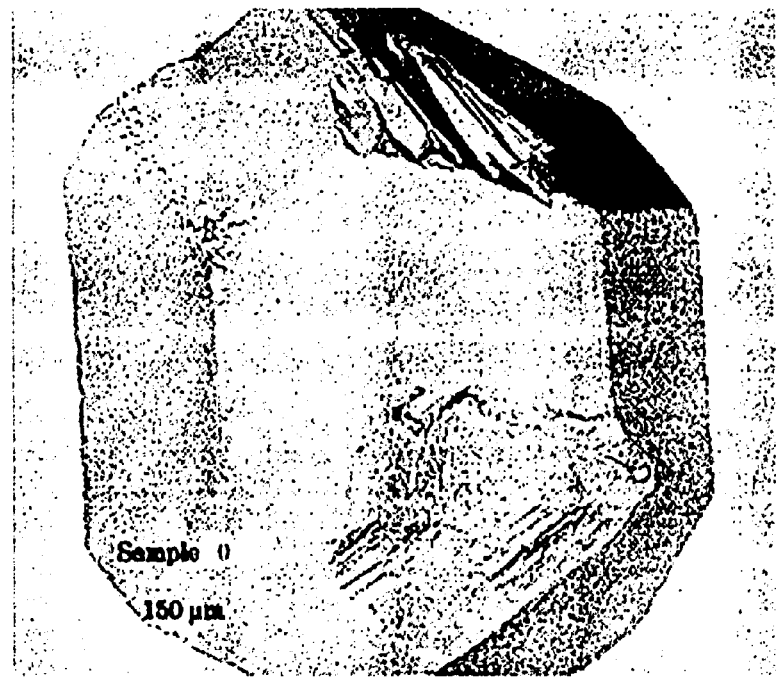
FIG. 3b is another scanning electron micrograph showing a diamond from the control sample before oxidation.
Figure 3C:
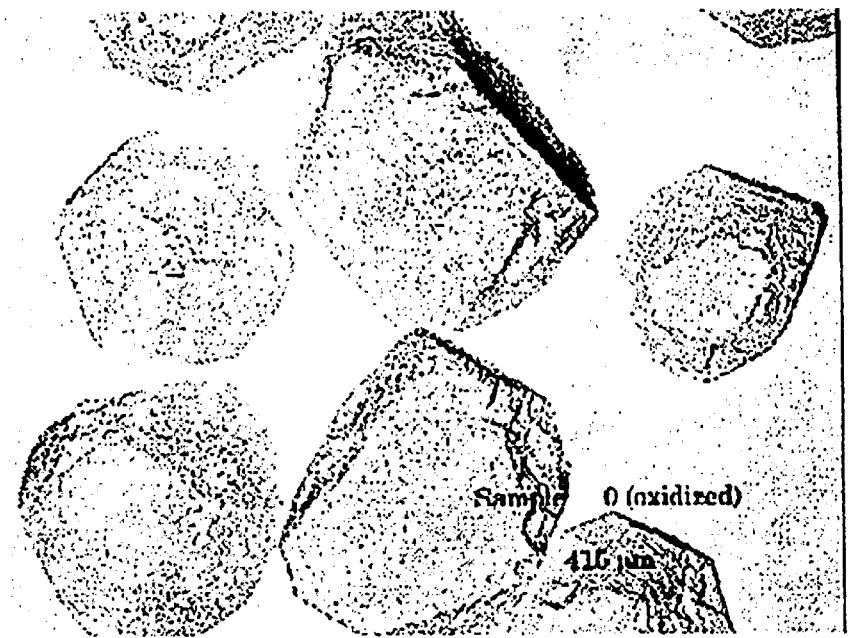
FIG. 3c is a scanning electron micrograph of diamonds from the control sample after oxidation.
Figure 3D:
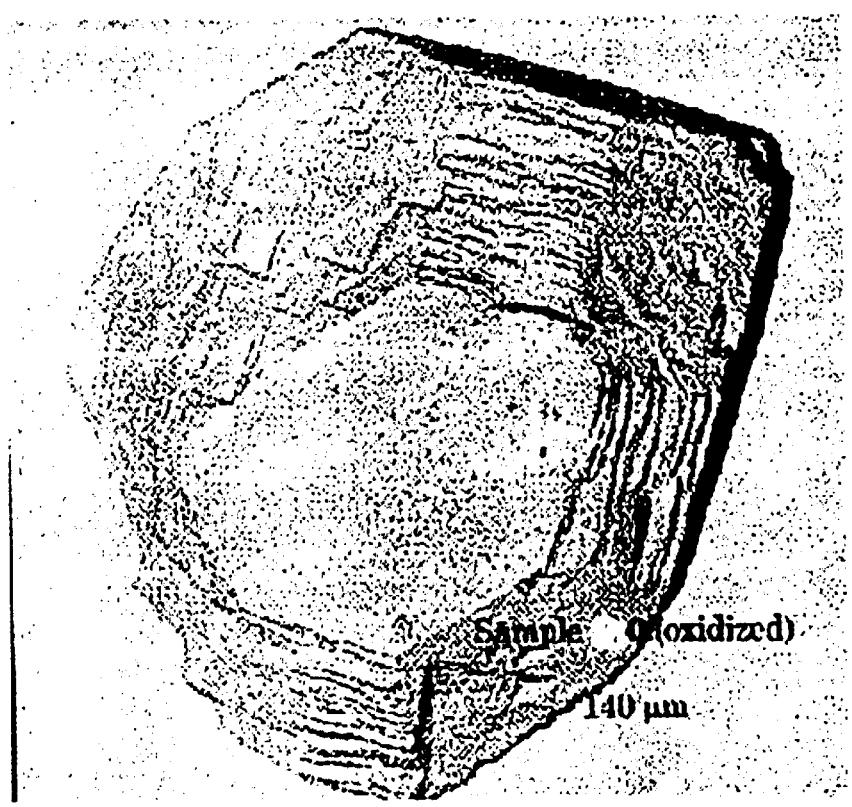
FIG. 3d is another scanning electron micrograph of a diamond from the control sample after oxidation.

FIG. 3a is a scanning electron micrograph of diamonds from the control sample before oxidation thereof; FIG. 3b is another scanning electron micrograph showing a diamond from the control sample before oxidation; FIG. 3c is a scanning electron micrograph of diamonds from the control sample after oxidation; and FIG. 3d is another scanning electron micrograph of a diamond from the control sample after oxidation. Comparing FIG. 3c and FIG. 3d to FIGS. 3a and 3b, break down of the corners and edges between the facets of the individual diamonds due to the oxidation is evident.

Figure 3E:
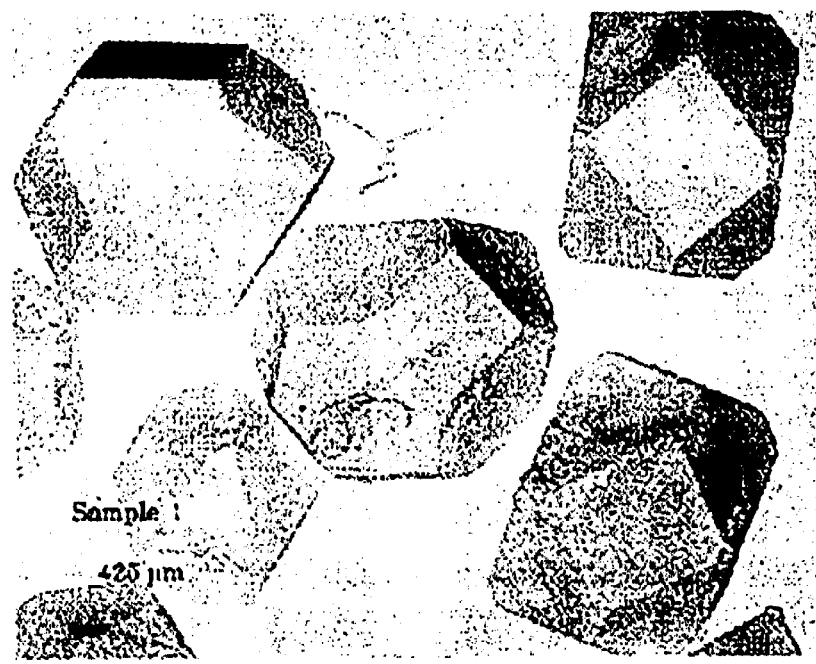
FIG. 3e is a scanning electron micrograph of diamonds having boron diffused therein according to the method of the present invention before oxidation thereof.
Figure 3F:
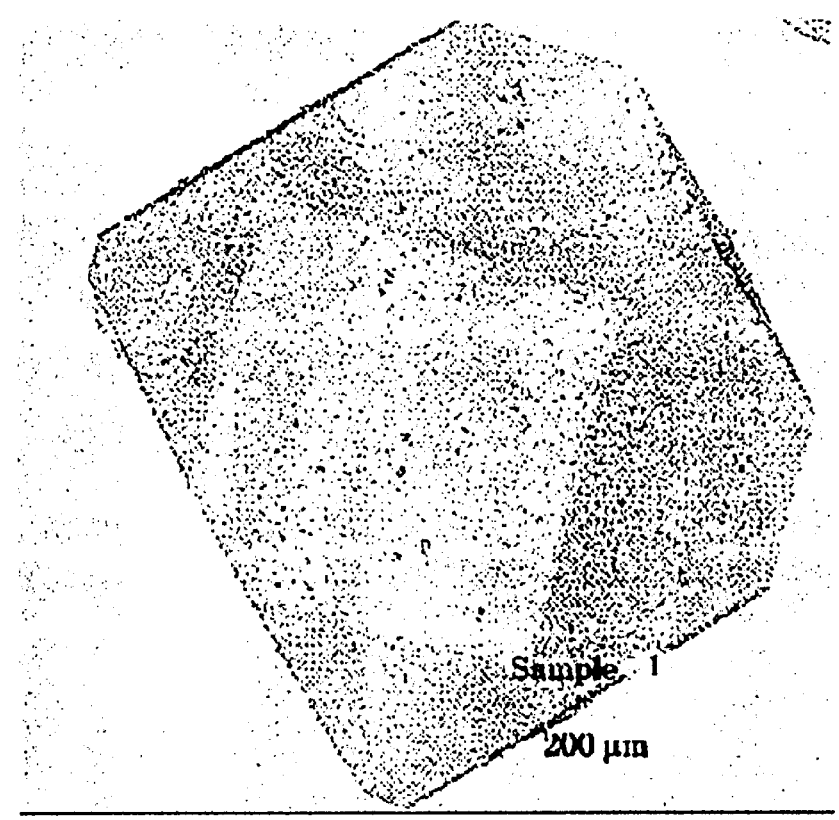
FIG. 3f is a scanning electron micrograph of a diamond having boron diffused therein according to the present invention before oxidation thereof.
Figure 3G:
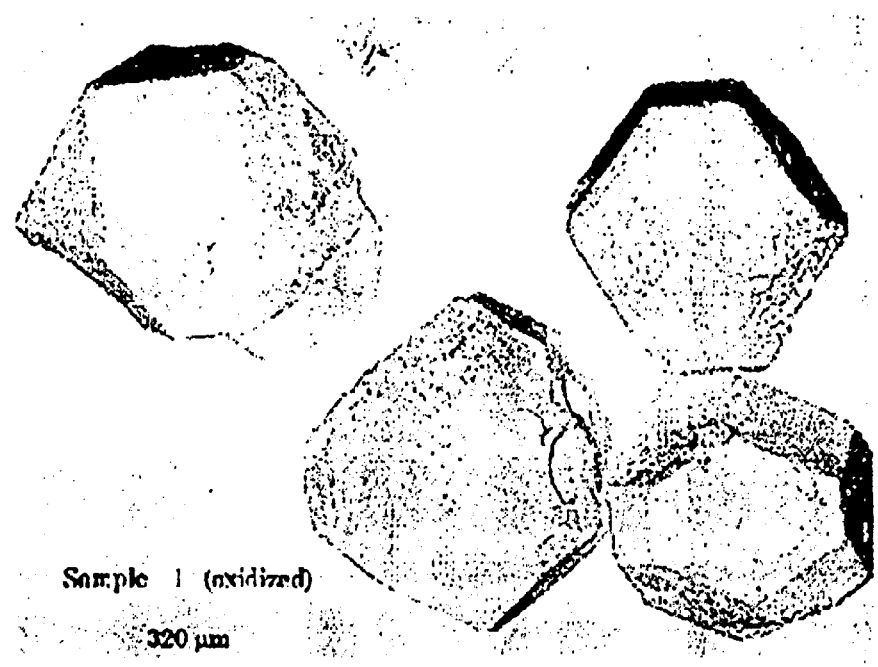
FIG. 3g is a scanning electron micrograph of diamonds having boron diffused therein according to the invention after oxidation thereof.
Figure 3H:
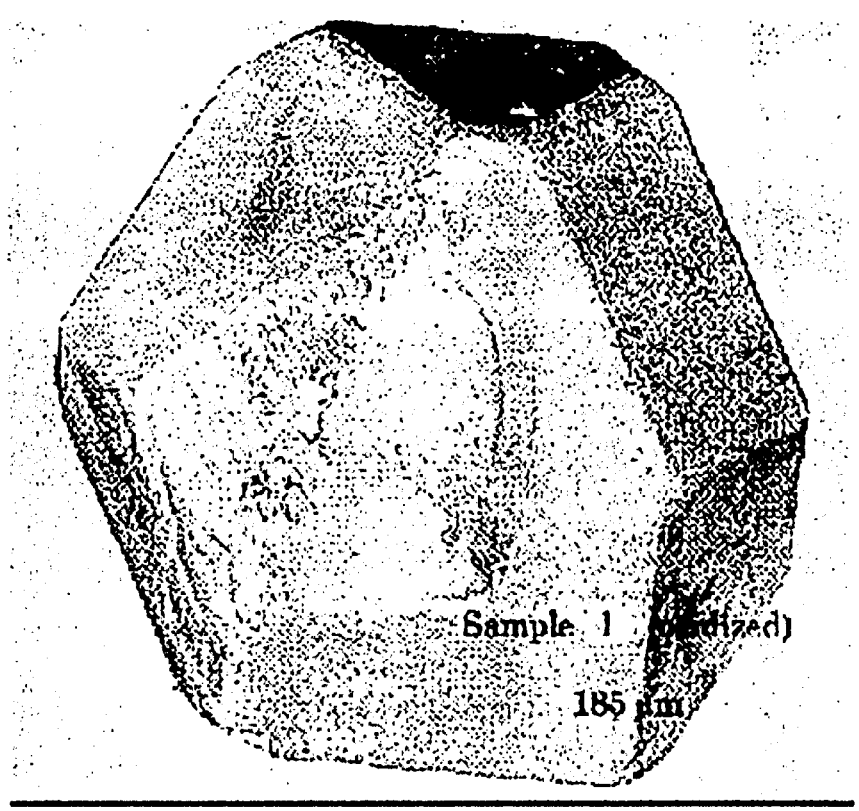
FIG. 3h is a scanning electron micrograph of a diamond having boron diffused therein according to the present invention after oxidation thereof.

FIG. 3e is a scanning electron micrograph of diamonds having boron diffused therein according to the method of the present invention before oxidation thereof; FIG. 3f is a scanning electron micrograph of a diamond having boron diffused therein according to the present invention before oxidation thereof; FIG. 3g is a scanning electron micrograph of diamonds having boron diffused therein according to the invention after oxidation thereof; and FIG. 3h is a scanning electron micrograph of a diamond having boron diffused therein according to the present invention after oxidation thereof. The diamonds of FIGS. 3e through 3h were taken from sample 3 and have a boron concentration of about 600 parts per million. Comparing the diamond crystals shown in FIGS. 3g and 3h to those of FIGS. 3e and 3f, little degradation of the crystals after oxidation is present, particularly with regard to the edges and corners.

Figure 3I:
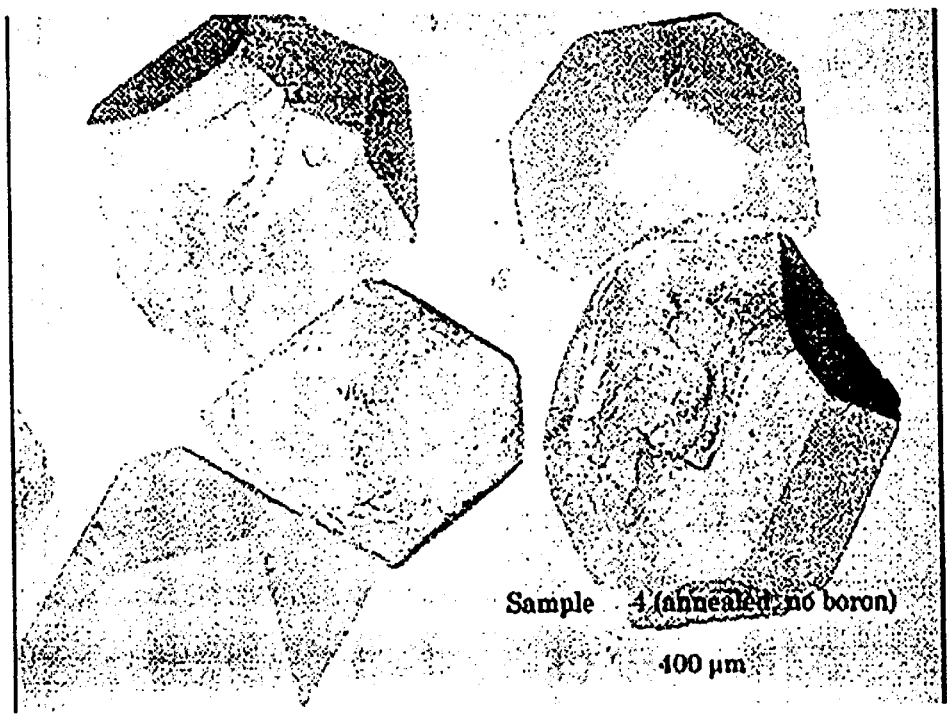
FIG. 3i is a scanning electron micrograph of diamonds without boron diffused therein after annealing.
Figure 3J:
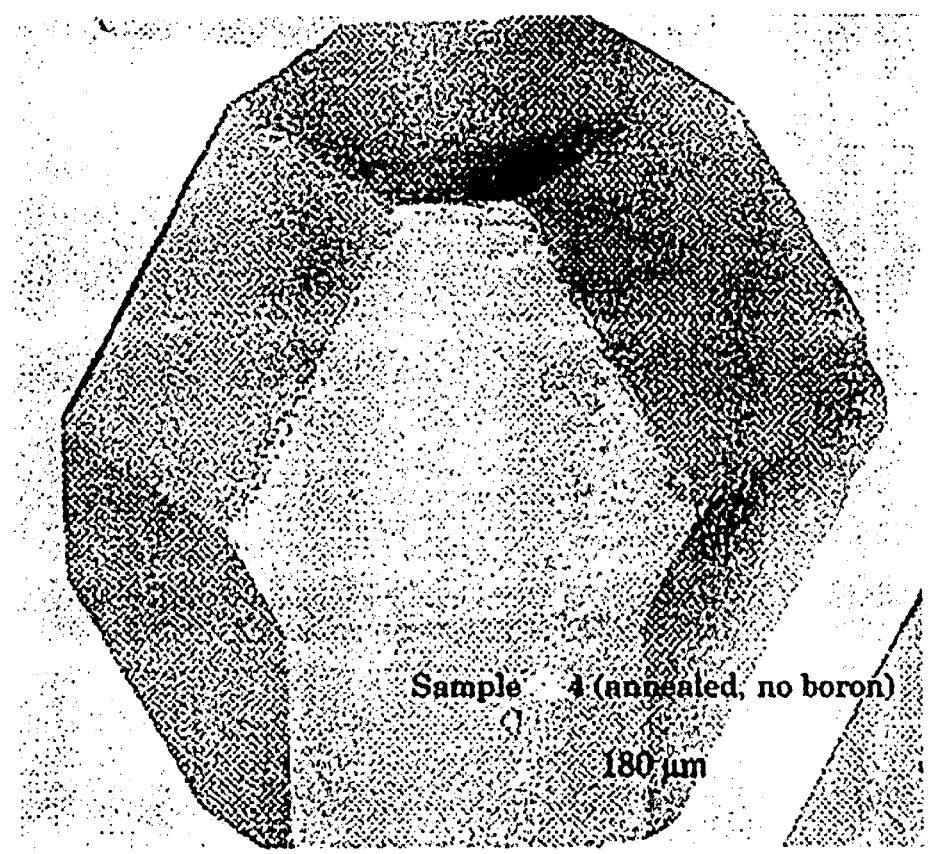
FIG. 3j is a scanning electron micrograph of a diamond without boron diffused therein after annealing.
Figure 3K:
FIG. 3k is a scanning electron micrograph of diamonds after annealing and oxidation thereof.
Figure 3L:
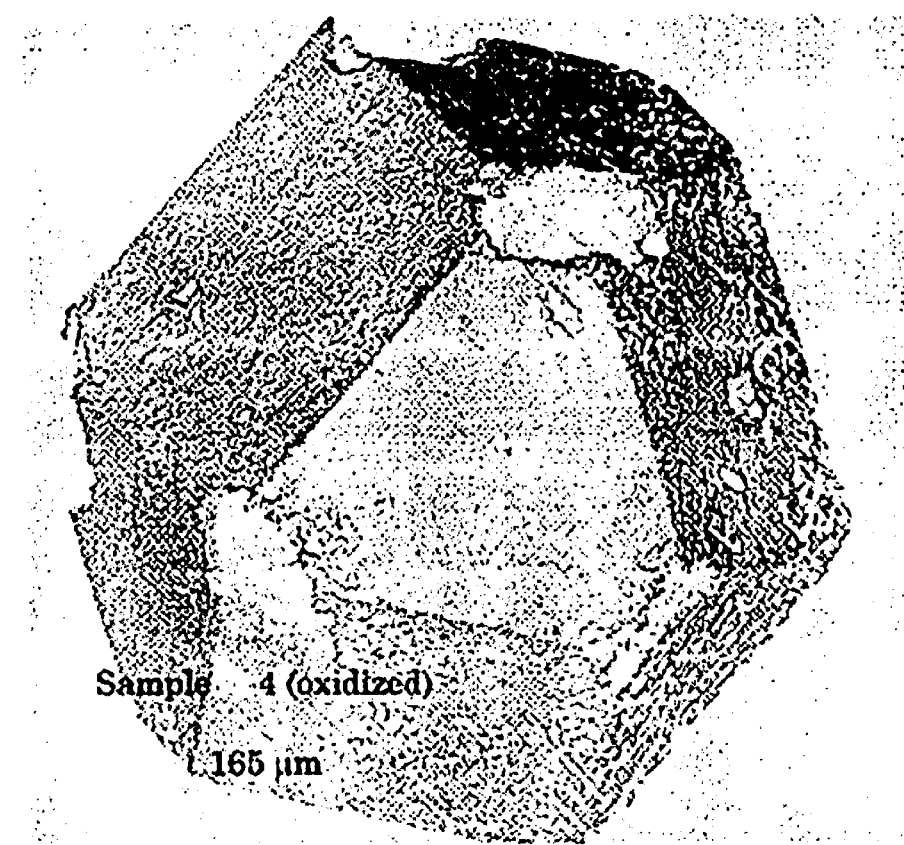
FIG. 3l is a scanning electron micrograph of a diamond after annealing and oxidation.

FIG. 3i is a scanning electron micrograph of diamonds without boron diffused therein after annealing; FIG. 3j is a scanning electron micrograph of a diamond without boron diffused therein after annealing; FIG. 3k is a scanning electron micrograph of diamonds after annealing and oxidation thereof; and FIG. 3l is a scanning electron micrograph of a diamond after annealing and oxidation. The diamonds of FIGS. 3i through 3l were taken from sample 4. Contrasting the diamonds before and after oxidation, it can been seen that oxidation of annealed diamond results in substantial degradation of crystalline structure.

Furthermore, contrasting the diamonds shown in FIGS. 3e through 3h having boron diffused therein, with both non-annealed diamonds as shown in FIGS. 3a through 3d, and annealed diamonds as shown in FIGS. 3i through 3l, it can been seen that diffusion of boron into the diamond crystals provides substantial resistance to oxidation resultant degradation.

Figure 4:
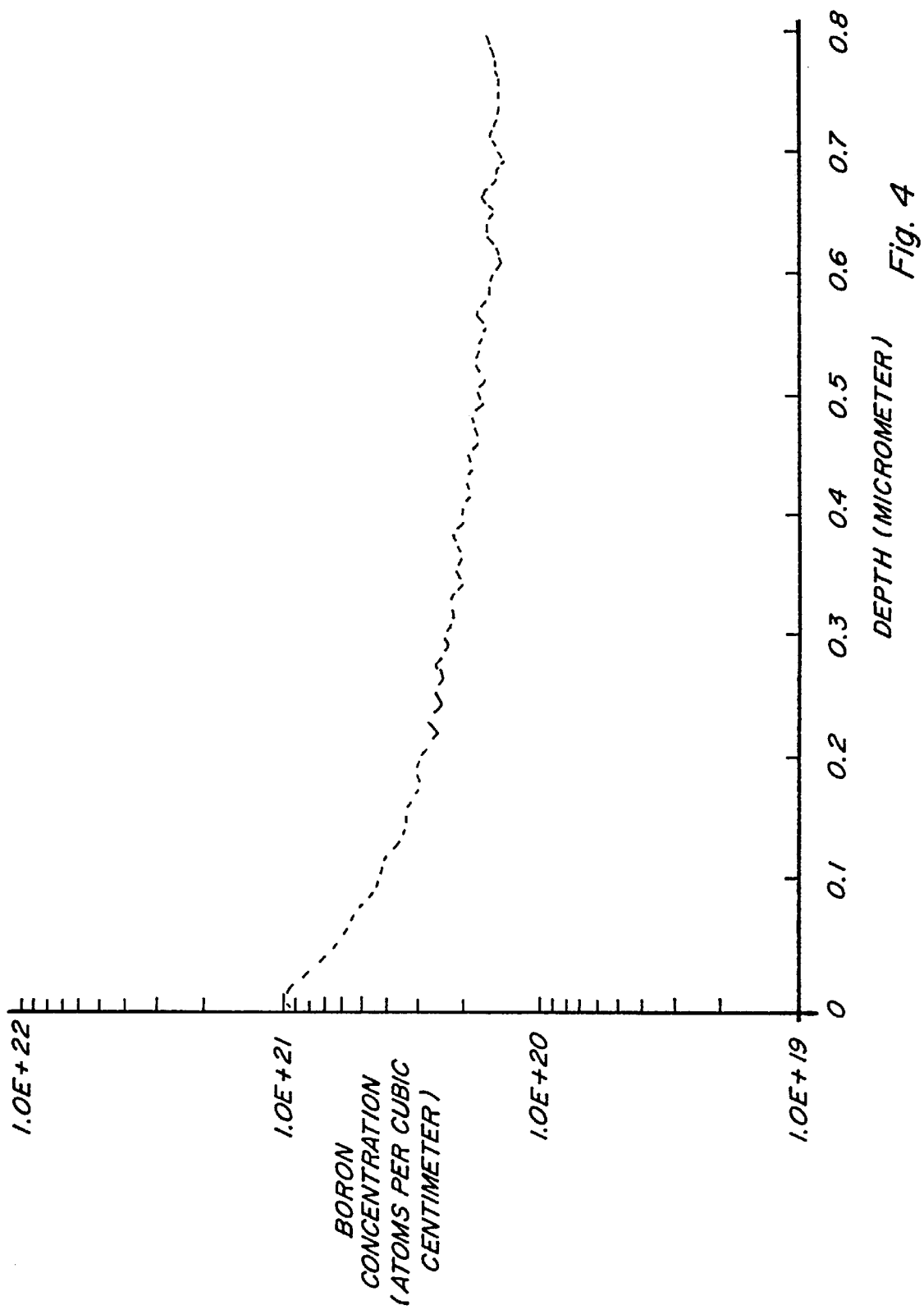
FIG. 4 is a graphical representation of concentration of the boron in the diamond structure after diffusion according to the present invention.

Turning to FIG. 4, boron concentration into the surface of a specimen diamond from sample 3 is illustrated, showing substantial boron concentration in the diamond lattice structure to a depth of at least 0.8 micrometer into the surface of the diamond. This concentration is consistent throughout the entire surface area of the diamond crystal.

The boron depth profile was performed using boron-neutron depth profiling. This is a technique used in nuclear science which measures the energy of alpha particles given of in a boron-neutron capture reaction. From the alpha particle energy spectra, the depth of the boron diffusion is determined and expressed as the concentration of born atoms per cubic centimeter of the diamond.

Industrial Applicability

The present method for contact diffusion of impurities into diamond and other crystalline structures has utility for a wide variety of different applications, including for providing diamonds and other crystalline elements with enhanced mechanical, chemical and electrical properties. For instance, the diamonds having boron diffused therein according to the above described method are anticipated to have utility for use in abrasive applications in a wide variety of constructions, including in slurries and in composites. As an abrasive, the diamonds having boron diffused therein according to the invention are anticipated to have wide utility for abrading ferrous materials which currently cause serious oxidation of diamond. Additionally, although the above discussed Examples refer to diffusion of only boron into diamond, diffusion of other substances, including lithium, nitrogen, oxygen, fluorine, sodium, aluminum, sulfur and chlorine has also been successfully diffused into crystalline elements using the present method. For example, lithium has been diffused into diamond to create an N-type semi-conductor.

Other aspects, objects and advantages of the present invention can be obtained from a study of the drawings, the disclosure and the appended claims.

What is claimed is:

1. A method for diffusing an impurity into a crystalline element having a multiple faceted outer surface, comprising the steps of:

(a) providing a mixture of the crystalline element and the impurity in a solid phase;

(b) treating the mixture to bring the impurity into conforming contact with the multiple faceted outer surface of the crystalline element; and (c) heating the mixture to a temperature of between about 200° C. and 2000° C.

2. The method of claim 1, wherein the crystalline element is selected from the group comprising natural diamond and synthetic diamond.

3. The method of claim 1, wherein the impurity is selected from the group comprising boron, lithium, nitrogen, oxygen, fluorine, sodium, aluminum, sulfur, chlorine and mixtures thereof.

4. The method of claim 1, wherein the mixture comprises the impurity and the crystalline element in a ratio of from about 0.1:1 to about 50:1 by weight or volume.

5. The method of claim 4, wherein the mixture comprises the impurity and the crystalline element in a ratio of about 5:1 by weight or volume.

6. The method of claim 1, wherein the mixture is heated to a temperature of about 1200° C.

7. The method of claim 1, wherein as a result of the heating step the impurity is diffused into the crystalline element at a ratio of at least about $1.0 \times 10^{20}$ atoms of the impurity per cubic centimeter of the crystalline element to a depth of at least one half micrometer from the outer surface of the crystalline element into essentially all of the outer surface of the crystalline element.

8. The method of claim 1, wherein the step of treating the mixture comprises compaction thereof.

9. The method of claim 8, wherein the compaction is achieved by pressing the mixture.

10. The method of claim 8, wherein the compaction is achieved by vibrating the mixture.

11. The method of claim 1, wherein during the heating step the mixture is enveloped in a flow of gas comprised of at least hydrogen gas.

12. The method of claim 11, wherein the gas flow additionally comprises a rare gas selected from the group consisting of helium, neon, xenon, krypton, argon and mixtures thereof.

13. The method of claim 12, wherein the gas flow comprises a mixture of hydrogen and other rare gases at a flow rate from about 0.1 cc per minute to about 100 liters per minute at a ratio of from about 100 parts to about 0.01 part rare gas to 1 part hydrogen by weight.

14. The method of claim 1, wherein during the heating step the mixture is enveloped in a flow of gas comprised of at least helium gas.

15. The method of claim 1, wherein during the heating step the mixture is enveloped in a flow of gas comprised of at least argon gas.

16. The method of claim 1, wherein during the heating step the mixture is enveloped in a flow of gas comprised of at least a rare gas.

17. The method of claim 1, wherein in the heating step, the mixture is heated for a time period of from about 1 minute to about 500 hours.

18. The method of claim 1, wherein the impurity comprises powdered boron having a grain size from about 0.1 micrometer to about 10 micrometers and the crystalline element comprises powered diamonds having grain sizes from about 50 micrometers to about 500 micrometers in a ratio of about 1:50 parts by weight of boron to diamond.

19. The method of claim 1, wherein the impurity comprises powdered boron having a grain size from about 50 micrometers to about 500 micrometers and the crystalline element comprises powered diamonds having grain sizes from about 0.004 micrometer to about 10 micrometers in a ratio of about 1:50 parts by weight or volume of the boron to the diamond.

* * * * *